United States Patent
Hussein

(10) Patent No.: US 6,169,024 B1
(45) Date of Patent: Jan. 2, 2001

(54) PROCESS TO MANUFACTURE CONTINUOUS METAL INTERCONNECTS

(75) Inventor: Makarem A. Hussein, Beaverton, OR (US)

(73) Assignee: Intel Corporation, Santa Clara, CA (US)

(*) Notice: Under 35 U.S.C. 154(b), the term of this patent shall be extended for 0 days.

(21) Appl. No.: 09/163,847

(22) Filed: Sep. 30, 1998

(51) Int. Cl.[7] .................................................. H01L 21/441
(52) U.S. Cl. ........................... 438/627; 438/628; 438/629; 438/687; 438/688
(58) Field of Search ............................ 438/195, 183, 438/192, 228, 230, 944, 190, 229, 627, 628, 629, 687, 688, 643, 653

(56) References Cited

U.S. PATENT DOCUMENTS

| | | |
|---|---|---|
| 3,705,060 | 12/1972 | Stork . |
| 4,016,050 | 4/1977 | Lesh et al. . |
| 4,960,732 | 10/1990 | Dixit et al. . |
| 4,996,584 | 2/1991 | Young et al. . |
| 5,008,216 | 4/1991 | Huang et al. . |
| 5,063,169 * | 11/1991 | De Bruin et al. ................ 437/41 |
| 5,127,986 * | 7/1992 | August et al. ................ 156/643 |
| 5,130,229 * | 7/1992 | Chang et al. ................ 430/312 |
| 5,151,168 | 9/1992 | Gilton et al. . |
| 5,158,910 * | 10/1992 | Cooper et al. ................ 437/195 |
| 5,169,680 * | 12/1992 | Ting et al. ................ 437/41 |
| 5,275,973 | 1/1994 | Gelatos . |
| 5,316,974 | 5/1994 | Crank . |
| 5,354,712 | 10/1994 | Ho et al. . |
| 5,371,041 | 12/1994 | Liou et al. . |
| 5,436,504 | 7/1995 | Chakravorty et al. . |
| 5,500,559 | 3/1996 | Miyata et al. . |
| 5,527,739 | 6/1996 | Parrillo et al. . |
| 5,595,937 | 1/1997 | Mikagi . |
| 5,674,787 | 10/1997 | Zhao et al. . |
| 5,695,810 | 12/1997 | Dubin et al. . |
| 5,714,418 | 2/1998 | Bai et al. . |
| 5,744,376 | 4/1998 | Chan et al. . |
| 5,770,517 | 6/1998 | Gardner et al. . |
| 5,770,519 | 6/1998 | Klein et al. . |

* cited by examiner

Primary Examiner—Charles Bowers
Assistant Examiner—Laura M Schillinger
(74) Attorney, Agent, or Firm—Blakely, Sokoloff, Taylor & Zafman LLP

(57) ABSTRACT

A method of forming an interconnection that includes introducing a barrier material in a via of a dielectric to a circuit device on a substrate in such a manner to deposit the barrier material on the circuit device, introducing a seed material into the via in manner that leaves the barrier material overlying the circuit device substantially exposed, substantially removing the barrier material overlying the circuit device, and introducing a conductive material into the via to form the interconnection.

13 Claims, 2 Drawing Sheets under pencil eraser US 6,169,024 B1

PROCESS TO MANUFACTURE CONTINUOUS METAL INTERCONNECTS

BACKGROUND OF THE INVENTION

1. Field of the Invention

The invention relates to integrated circuit processing and, more particularly, to the patterning of interconnection lines on an integrated circuit.

2. Description of Related Art

Modern integrated circuits use conductive interconnections to connect the individual devices on a chip or to send and receive signals external to the chip. Popular types of interconnections include aluminum alloy interconnection lines and copper interconnection lines coupled to individual devices, including other interconnection lines, by interconnections through vias.

A typical method of forming an interconnection is a damascene process that involves forming a via and an overlying trench in a dielectric to an underlying circuit device, such as a transistor or an interconnection line. The via and trench are then lined with a barrier layer of a refractory material. Common refractory materials include titanium nitride (TiN) or tantalum (Ta). The barrier layer serves, in one aspect, to inhibit the diffusion of the interconnection material that will subsequently be formed in the via into the dielectric. Next, a suitable seed material is deposited on the wall or walls and base of the via. Suitable seed materials for the deposition of copper interconnection material include copper and nickel. Next, interconnection material, such as copper, is deposited in a sufficient amount to fill the via and trench using, for example, an electroplating process. Thus, the interconnection formed in the via includes the barrier layer material since barrier layer material lines the base of the via.

A second method for forming an interconnection is described in the U.S. patent application Ser. No. 09/001,349, filed Dec. 31, 1997, assigned to Intel Corporation of Santa Clara, Calif., and titled "A Single Step Electroplating Process for Interconnect Via Fill and Metal Line Patterning." That method includes forming a via in a dielectric to an underlying circuit device, such as a transistor or an interconnection line. The via and a top surface of the dielectric are then lined and covered with a barrier layer and a suitable seed material, respectively. A layer of photoresist or other masking material is then patterned over the seed material covering the top of the dielectric. An electroplating process is used to deposit a conductive material such as copper to fill the via and form an interconnection line over the dielectric according to the patterned masking material. The masking material and underlying conductive material is then removed. Once again, the interconnection formed in the via generally includes the barrier layer since barrier layer material lines the base of the via.

In general, the resistivity of the barrier layer material is much greater than the resistivity of copper. Thus, the inclusion of the barrier layer material at the base of the via and as part of the interconnection increases the resistivity of the interconnection. What is needed is an interconnection having reduced resistivity and a method of forming an interconnection with reduced resistivity compared to the prior art.

SUMMARY OF THE INVENTION

A method of forming an interconnection is disclosed. The method includes introducing a barrier material in a via of a dielectric to a circuit device on a substrate in such a manner to deposit the barrier material on the circuit device. A seed material is introduced into the via in manner that leaves the barrier material overlying the circuit device substantially exposed. The barrier material overlying the circuit device is substantially removed and a conductive material is introduced into the via to form the interconnection.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

The invention relates to a method of forming an interconnection. Compared to prior art interconnections, the invention is useful in one aspect in reducing the resistivity of the interconnection by allowing direct contact between an interconnection and a conductive device, such as an interconnection through a via to an underlying interconnection line.

FIGS. 1–6 illustrate a process for forming an interconnection over an underlying interconnection line, such as for example, a copper interconnection line. A typical integrated circuit such as a microprocessor chip may have, for example, four or five interconnection layers stacked one on top of the other each insulated from one another by dielectric material. FIGS. 1–6 illustrate, for example, the formation of a second interconnection line of such a circuit over and to be electrically connected to a first interconnection line through an interconnection. It is to be appreciated that the method of the invention may be used for various interconnections within an integrated circuit including to circuit devices and other interconnection lines.

Figure 1:
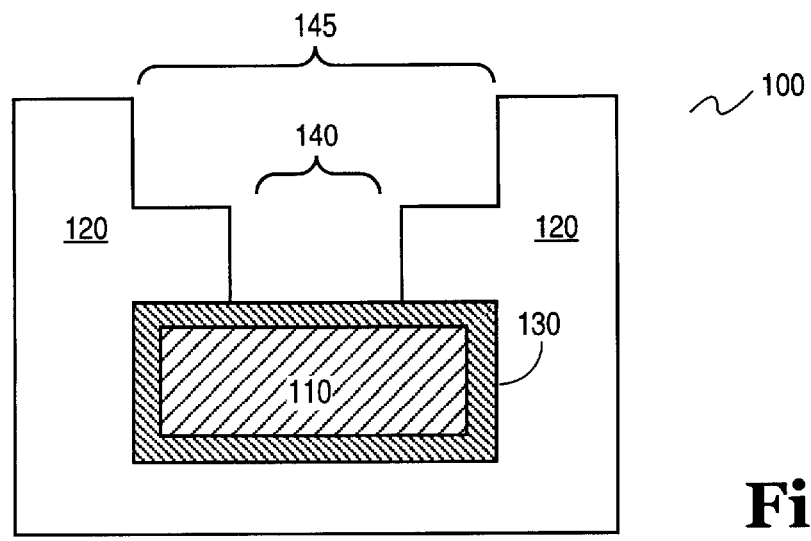
FIG. 1 illustrates a cross-sectional side view of a portion of a substrate showing an interconnection insulated by a dielectric material, a barrier material surrounding the interconnection, and a via and a trench formed in the dielectric material to the interconnection in accordance with an embodiment of the invention.

FIG. 1 illustrates a cross-sectional side view of a portion of a substrate or wafer having a first copper interconnection line 110 formed in dielectric material 120. Only dielectric material 120 and first copper interconnection line 110 of the substrate are illustrated. Copper interconnection line 110 is, for example, coupled to an underlying device or devices formed in or on a semiconductor substrate. Dielectric material 120 is, for example, silicon dioxide ($SiO_2$) formed by a tetraethyl orthosilicate (TEOS) or a plasma enhanced chemical vapor deposition (PECVD) source. Dielectric material 120 may also be a material having a low dielectric constant (a "low k" material), including a polymer, as known in the art.

Surrounding copper interconnection line 110 in FIG. 1 is barrier material 130. In this example, barrier material 130 is silicon nitride ($Si_3N_4$) deposited to a thickness of approximately 10–50 nanometers (nm) generally depending on the desired characteristics of the barrier layer (e.g., diffusion barrier characteristics). Barrier material 130 may also serve, in one embodiment, to protect copper interconnection line 110 from oxidation (e.g., during oxygen plasma etching) following the patterning of copper interconnection line 110.

FIG. 1 shows via 140 through dielectric material 120 to expose barrier material 130. FIG. 1 also shows trench 145 formed in a portion of dielectric material 120 over via 140. A trench and a via may be cut according to known techniques by, for example, initially using a mask, such as a photoresist mask, to define an area for the opening and etching the via with a suitable etch chemistry, such as, for example, a $CH_3/CF_4$ or $C_4F_8$ etch chemistry for $SiO_2$. The mask may then be removed (such as by an oxygen plasma to remove photoresist) and a second mask patterned to define an area for a trench opening. A subsequent etch forms the trench and the second mask is removed leaving the substrate shown in FIG. 1.

Figure 2:
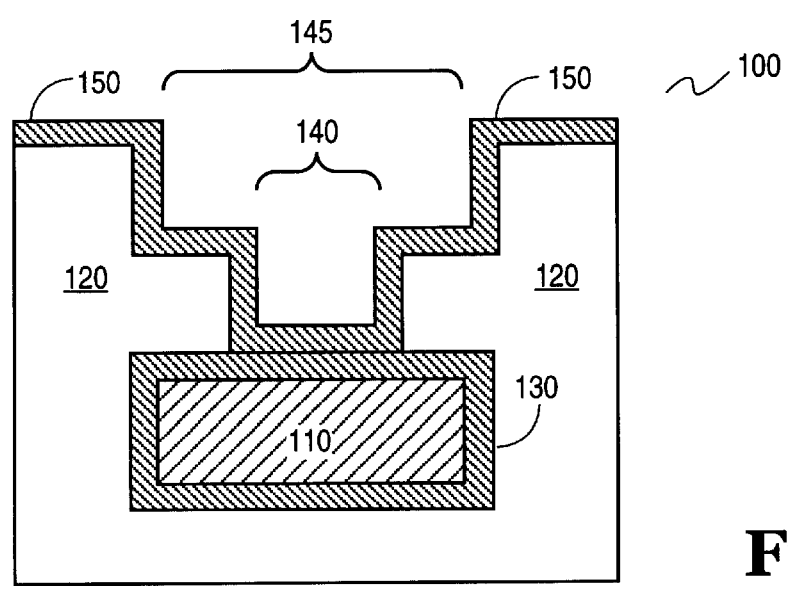
FIG. 2 shows the substrate of FIG. 1 after the further processing step of patterning a barrier layer to overly the surface of the dielectric material and the side walls of the via and trench and to overly the copper interconnection line in accordance with an embodiment of the invention.

FIG. 2 shows the substrate of FIG. 1 after the further processing step of depositing barrier material 150 over the exposed surface of dielectric layer 120 and in via 140. Barrier material 150 is deposited to a thickness of approximately 10–50 nm depending on the desired characteristics of the barrier material. For example, barrier material 150 is chosen, in one embodiment, to be effective to inhibit conductive material diffusion, such as copper diffusion into dielectric material 120. Barrier material 150 is also chosen, in this embodiment, to have sufficiently different etch characteristics than a seed material that will be applied subsequently. Suitable barrier material 150 includes, but is not limited to, $Si_3N_4$ and TiN. As will become apparent from the discussion below, in one embodiment, barrier material 150 is chosen to be of the same material as barrier material 130.

Figure 3:
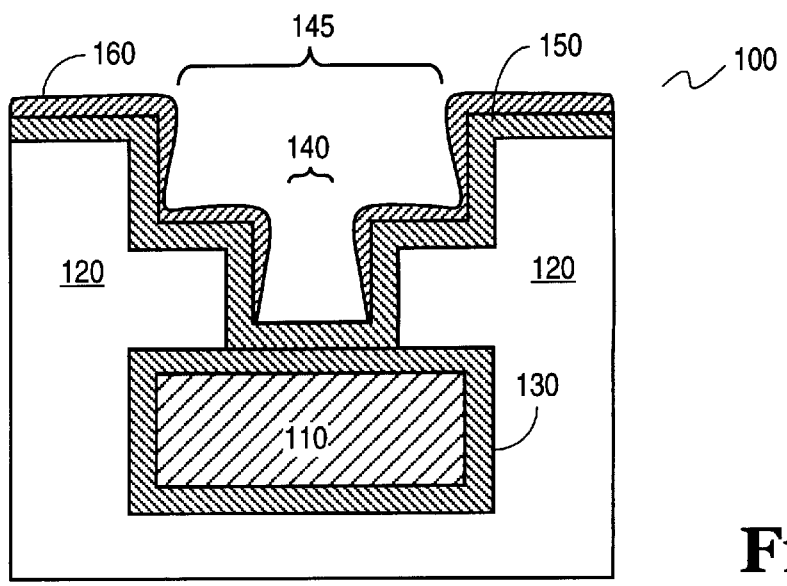
FIG. 3 shows the substrate of FIG. 1 after the further processing step of introducing a seed material over the top surface of the dielectric and predominantly along the side walls of the via and trench in accordance with an embodiment of the invention.

FIG. 3 shows substrate 100 after the further processing step of depositing seed material 160 over the top surface of substrate 100 and predominantly along the side walls of via 140 and trench 145. Seed material 160 is used, in one sense, in a subsequent electroplating process to form an interconnection in via 140 and trench 150. While barrier material 150 may be a conductive material such as a titanium compound that may be capable of carrying a current that may be utilized in the electroplating process, barrier material 150 is generally not a good conductor and may cause non-uniform current flow which, in turn, may adversely effect the electroplating process and the reliability of the fabricated integrated circuit. Seed material 160, on the other hand, generally provides uniform current flow during electroplating. Moreover, seed material 160 provides enhanced adhesion of the subsequently formed interconnection to the substrate.

In one embodiment, seed material is, for example, a copper material deposited using standard sputter deposition techniques. Due to the inherent characteristics of the sputter deposition process, the thickness of the deposited copper is shown to be approximately 100 percent, 40 percent, and 5 percent, of the target thickness of seed material 160 on the top surface of substrate 100, the side walls of via 140, and the bottom of via 140, respectively. Thus, by proper targeting of the deposited seed material 160, on the top surface of substrate 100, an insignificant amount of seed material is deposited on the bottom surface of via 140 (i.e., over barrier material 150 at the base of via 140). Thus, in one aspect, the invention seeks to provide a sufficient amount of seed material 160 to seed an interconnection while minimizing the amount of seed material that is deposited at the base of via 140.

Figure 4:
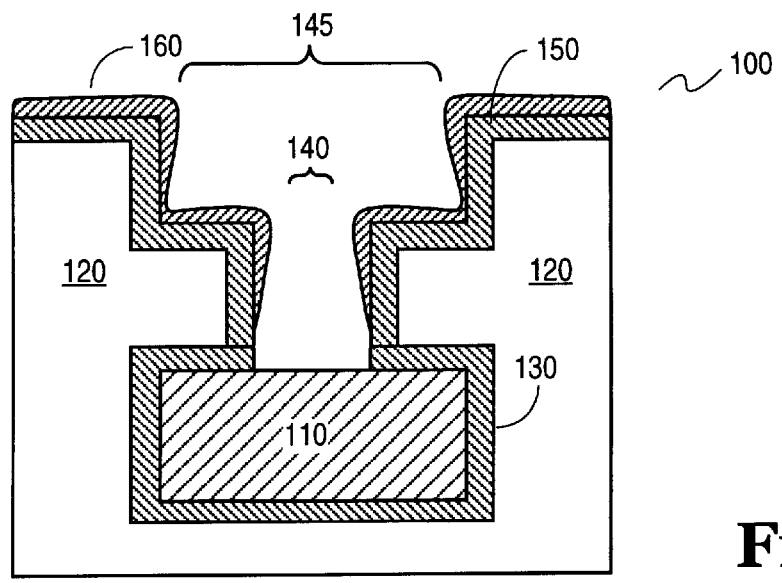
FIG. 4 shows the substrate of FIG. 1 after the further processing step of exposing the underlying interconnection line in accordance with an embodiment of the invention.

FIG. 4 shows the subsequent processing step of etching barrier material 150 and barrier material 130 from the base of via 140 to expose underlying copper interconnection line 110. In this example, seed material 160, properly targeted to minimize the amount of material in the bottom of via 140, acts as a mask during the etching of barrier material. Thus, as noted above, in one embodiment, the material chosen for barrier material 150 and barrier material 130 should have sufficiently different etch characteristics than seed material 160 such that seed material 160 may act as a mask to protect barrier material 150 along the wall or walls of via 140 and trench 145. In the example where barrier material 150 and barrier material 130 are each $Si_3N_4$, a fluorine chemistry in the presence of energetic argon ions may be used to selectively etch barrier material 150 and barrier material 130 and maintain seed material 160 on the top surface of substrate 100 and along the side wall or walls of via 140 and trench 145. It is to be appreciated that any insignificant amount of seed material 160 deposited at the base of via 140 in the deposition described above may be removed during the selective etch of barrier material 150 and barrier material 130. FIG. 4 shows that once the etching of barrier material 150 and barrier material 130 is complete, underlying copper interconnection line 110 is exposed.

Figure 5:
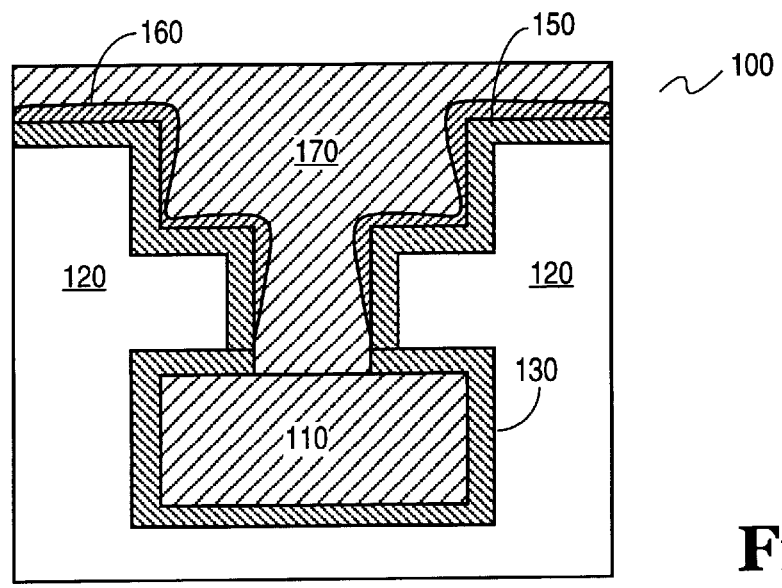
FIG. 5 shows the substrate of FIG. 1 after the further processing step of forming a copper interconnection in the via and trench in accordance with an embodiment of the invention.

FIG. 5 shows substrate 100 after the subsequent processing step of filling via 140 and forming a subsequent copper interconnection line 170 by, for example, a conventional copper electroplating process. By way of example, metallic ions in a pH neutral copper-based solution, such as a copper sulfate-based solution, may be reduced to a metallic state by applying current between seed material 160 and an anode of an electroplating cell in the presence of the solution. Copper metal becomes deposited onto seed material 160 to fill via 140 and form copper interconnection line 170.

FIG. 5 shows that continuous interconnection lines may be formed on a substrate and connected directly to one another without an intervening barrier material layer as is done in the prior art. In this manner, the resistivity of each interconnection is reduced, the resistivity of the interconnection lines is reduced, and the resistivity of an integrated circuit formed according to the methods described above is reduced relative to prior art methods.

Figure 6:
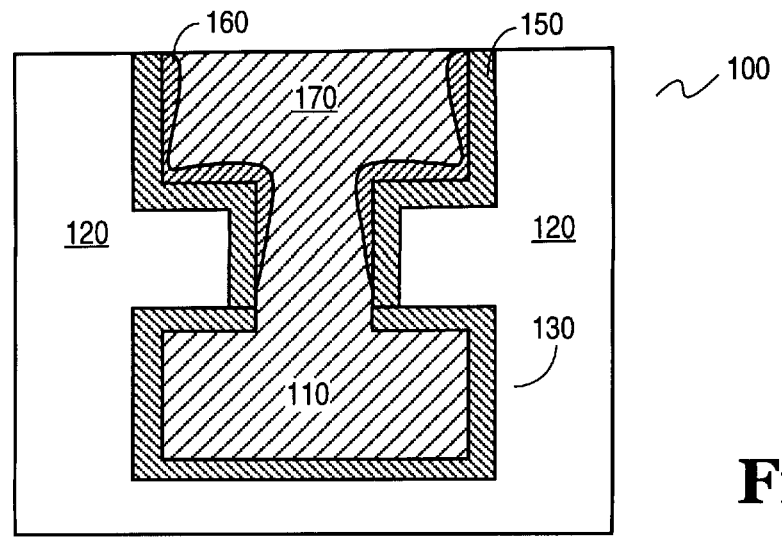
FIG. 6 shows the substrate of FIG. 1 after the further processing step of planarizing the upper surface of the substrate in accordance with an embodiment of the invention.

FIG. 6 shows substrate 100 after the further processing step of planarizing the top surface of substrate 100. The planarization step may be accomplished, for example, by a chemical-mechanical polish as known in the art. In this embodiment, the planarization step proceeds to dielectric material 120 thus substantially removing barrier material and seed material present on the upper surface of dielectric material 120.

The above method of the invention has been described with respect to inventive modifications to a damascene process. It is to be appreciated that the method of the invention has equal applicability to other interconnection formation processes, including the process described in the U.S. patent application Ser. No. 09/001,349. Exemplary of that process is the use of a lithographic or masking step to define the interconnection line. Thus, for example, the portion of the top surface of the dielectric that is not covered with photoresist will provide a conductive path to the electroplating solution. Therefore, the interconnection line formed by the electroplating process will overly a portion of the top surface of the dielectric. Using the techniques of the invention, the interconnection line will be directly coupled to an underlying circuit device, including an underlying interconnection line, without an intervening barrier material.

The above method of forming an interconnection has been described with respect to copper interconnections and copper interconnection lines. It is to be appreciated that similar processing techniques may be used for other interconnection materials, including, but not limited to, aluminum alloy interconnections. The invention describes an integrated circuit and a method of producing an integrated circuit utilizing interconnections with reduced resistivity as compared to prior art interconnections having intervening barrier layers between interconnections.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of forming an interconnection, comprising:
   introducing a barrier material in a via of a dielectric to a circuit device on a substrate in such a manner to deposit the barrier material on the circuit device;
   introducing a seed material into the via in a manner that leaves the barrier material overlying the circuit device substantially exposed;
   substantially removing the barrier material overlying the circuit device in the via; and
   introducing a conductive material in the via to form the interconnection.

2. The method of claim 1, wherein introducing a seed material comprises sputter depositing the seed material into the via.

3. The method of claim 1, wherein the barrier material comprises etch characteristics such that the barrier material may be selectively etched in the presence of the seed material.

4. The method of claim 1, wherein the circuit device is an interconnection line.

5. The method of claim 1, wherein introducing the conductive material comprises electroplating.

6. A method of forming an interconnection on a substrate, comprising:
   providing a substrate having a circuit device, a dielectric material overlying the circuit device having a via through the dielectric to the circuit device;
   depositing a barrier material in the via to substantially cover the side walls of the via and the circuit device;
   introducing a seed material into the via in a manner that leaves the barrier material overlying the circuit device substantially exposed;
   substantially removing the barrier material in the via overlying the circuit device; and
   introducing a conductive material in the via to form the interconnection.

7. The method of claim 6, wherein introducing a seed material comprises sputter depositing the seed material.

8. The method of claim 7, wherein the step of introducing a seed material comprises introducing the seed material over a portion of a top surface of the dielectric material and an amount of seed material over the barrier material overlying the circuit device is about five percent or less of the amount overlying the top surface of the dielectric.

9. The method of claim 6, wherein the barrier material comprises etch characteristics such that the barrier material may be selectively etched in the presence of the seed material.

10. The method of claim 6, wherein the circuit device is an interconnection line.

11. The method of claim 6, wherein introducing a conductive material comprises electroplating.

12. The method of claim 1, wherein removing the barrier material comprises exposing the circuit device.

13. The method of claim 6, wherein removing the barrier material comprises exposing the circuit device.

* * * * *

UNITED STATES PATENT AND TRADEMARK OFFICE
CERTIFICATE OF CORRECTION

PATENT NO.     : 6,169,024 B1                                                Page 1 of 1
DATED          : January 2, 2001
INVENTOR(S)    : Hussein It is certified that error appears in the above-identified patent and that said Letters Patent is hereby corrected as shown below:

<u>Column 6,</u>
Line 27, before "introducing", delete "the step of".

Signed and Sealed this

First Day of April, 2003

JAMES E. ROGAN
*Director of the United States Patent and Trademark Office*